United States Patent
Joo et al.

(10) Patent No.: US 6,937,097 B2
(45) Date of Patent: Aug. 30, 2005

(54) HIGH-FREQUENCY POWER AMPLIFIER HAVING DIFFERENTIAL INPUTS

(75) Inventors: Jae Hong Joo, Seoul (KR); Kyong Ryol Kim, Seoul (KR); Kee Cheol Ahn, Seoul (KR); Jin Sung Choi, Seoul (KR)

(73) Assignees: Tachyonics Corp., Seoul (KR); Institute of Information Technology Assessment, Daejeon (KR)

( * ) Notice: Subject to any disclaimer, the term of this patent is extended or adjusted under 35 U.S.C. 154(b) by 29 days.

(21) Appl. No.: 10/668,607

(22) Filed: Sep. 24, 2003

(65) Prior Publication Data

US 2005/0062534 A1 Mar. 24, 2005

(30) Foreign Application Priority Data

Sep. 24, 2003 (KR) ................................ 10-2003-0066277

(51) Int. Cl.[7] ................................................ H03F 3/45
(52) U.S. Cl. ........................ 330/252; 330/133; 330/134; 330/302; 330/310
(58) Field of Search ................................ 330/133, 134, 330/252, 302, 310, 311

(56) References Cited

U.S. PATENT DOCUMENTS

| | | | | |
|---|---|---|---|---|
| 6,331,802 B1 | * | 12/2001 | Kim | ............................ 330/133 |
| 6,614,301 B2 | | 9/2003 | Casper et al. | |
| 6,617,931 B2 | * | 9/2003 | Theus et al. | ................ 330/310 |
| 6,642,790 B2 | | 11/2003 | Schrödinger et al. | |
| 6,781,455 B2 | * | 8/2004 | Kim | ............................ 330/310 |

* cited by examiner

Primary Examiner—Khanh V. Nguyen
(74) Attorney, Agent, or Firm—McDermott Will & Emery, LLP

(57) ABSTRACT

The present invention relates to a high-frequency power amplifier having differential inputs, and more specifically to a high-frequency power amplifier having differential inputs, in which a structure of an output port of a communication system for 2.4 GHz ISM frequency band can be simplified by designing and producing the high-frequency power amplifier having differential inputs for 2.4 GHz ISM frequency band using a silicon germanium (SiGe) microwave monolithic integrated circuit (MMIC), thereby decreasing the number of components of a transmission unit and reducing a price of the communication system.

4 Claims, 3 Drawing Sheets

HIGH-FREQUENCY POWER AMPLIFIER HAVING DIFFERENTIAL INPUTS

BACKGROUND OF THE INVENTION

1. Field of the Invention

The present invention relates to a high-frequency power amplifier having differential inputs, and more specifically to a high-frequency power amplifier having differential inputs, capable of simplifying a structure of an output port of a communication system for 2.4 GHz ISM frequency band by designing and producing a high-frequency power amplifier having differential inputs for 2.4 GHz ISM frequency band using a silicon germanium (SiGe) microwave monolithic integrated circuit (MMIC).

2. Background of the Invention

FIG. 1 is a constructional view showing an output port of a conventional communication system.

As shown in FIG. 1, a high-frequency transmission unit 10 of a conventional communication system has two output terminals. The signals output from the two output terminals are have phases inverted each other, and this output is referred to as "a balance output".

On the other hand, a conventional power amplifier 30 for amplifying and sending a signal to an antenna 40 has one input terminal and one output terminal. Therefore, a signal, which can be received by the conventional power amplifier 30, is so called "an unbalance signal". The unbalance signal means a signal not having a phase inverted from other signals.

Therefore, in order to amplify the signals output from a high-frequency transmission unit and send the amplified signals to the antenna, a signal conversion unit 20 for converting the balance signal into the unbalance signal and sending the unbalanced signal to an output amplifier is required. Generally, a balanced-to-unbalanced element (e.g. a BALUN element) which is a passive element is used as the signal conversion unit 20.

Accordingly, in the conventional power amplifier 30, there is a problem that the input signal is attenuated due to a characteristic of the BALUN element used in signal conversion.

Therefore, in the conventional power amplifier 30, the signal attenuated due to the BALUN element must be compensated to satisfy an output power of the antenna 40 required for the communication system. In other word, there is a problem that a power gain required for the power amplifier is increased.

SUMMARY OF THE INVENTION

The present invention is contrived to solve the above problems, and thus it is an object of the present invention to provide a high-frequency power amplifier having differential inputs, capable of obtaining an output power of an antenna required for a communication system without any attenuation by implementing an active element of a silicon germanium (SiGe) microwave monolithic integrated circuit (MMIC) as a conversion element for converting a balance signal into an unbalance signal.

Furthermore, it is another object of the present invention to provide a high-frequency power amplifier having differential inputs, having functions of breaking and controlling a power implemented in an output port of a communication system as well as a function of amplifying an output signal of a high-frequency transmission unit and sending the amplified signal to an antenna by using a silicon germanium (SiGe) microwave monolithic integrated circuit (MMIC).

Furthermore, it is still another object of the present invention to provide a high-frequency power amplifier having differential inputs, capable of reducing the number of elements in a transmission unit of a communication system and a cost for the communication system by simplifying a structure of an output port of the communication system for 2.4 GHz ISM frequency band.

In order to achieve the above objects, a high-frequency power amplifier having differential inputs according to the present invention comprises: a power supply unit; a first amplification circuit unit for amplifying high-frequency differential input signals of differential input terminals INA, INB into outputting a single high-frequency signal; an intermediate impedance matching unit for impedance-matching the single high-frequency signal amplified by the first amplification circuit unit; a second amplification circuit unit for receiving and amplifying the impedance-matched single high-frequency signal from the intermediate impedance matching unit and outputting the amplified signal to an antenna through an output terminal thereof; a power control circuit unit for controlling a power output to the antenna through the output terminal of the second amplification circuit unit by varying a voltage of a power control terminal; a first bias circuit unit for determining an operation reference point of the first amplification circuit unit; and a second bias circuit unit for determining an operation reference point of the second amplification circuit unit.

BRIEF DESCRIPTION OF THE DRAWINGS

The above and other objects, advantages and features of the present invention will become apparent from the following description of preferred embodiments given in conjunction with the accompanying drawings, in which.

DETAILED DESCRIPTION OF THE PREFERRED EMBODIMENTS

Now, preferred embodiments of the present invention will be described in detail with reference to the accompanying drawings.

Figure 1:
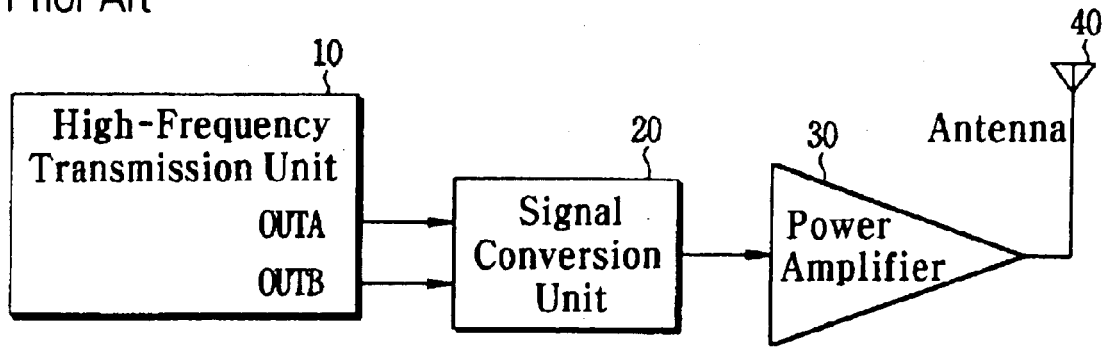
FIG. 1 is a constructional view showing an output port of a conventional communication system.
Figure 2:
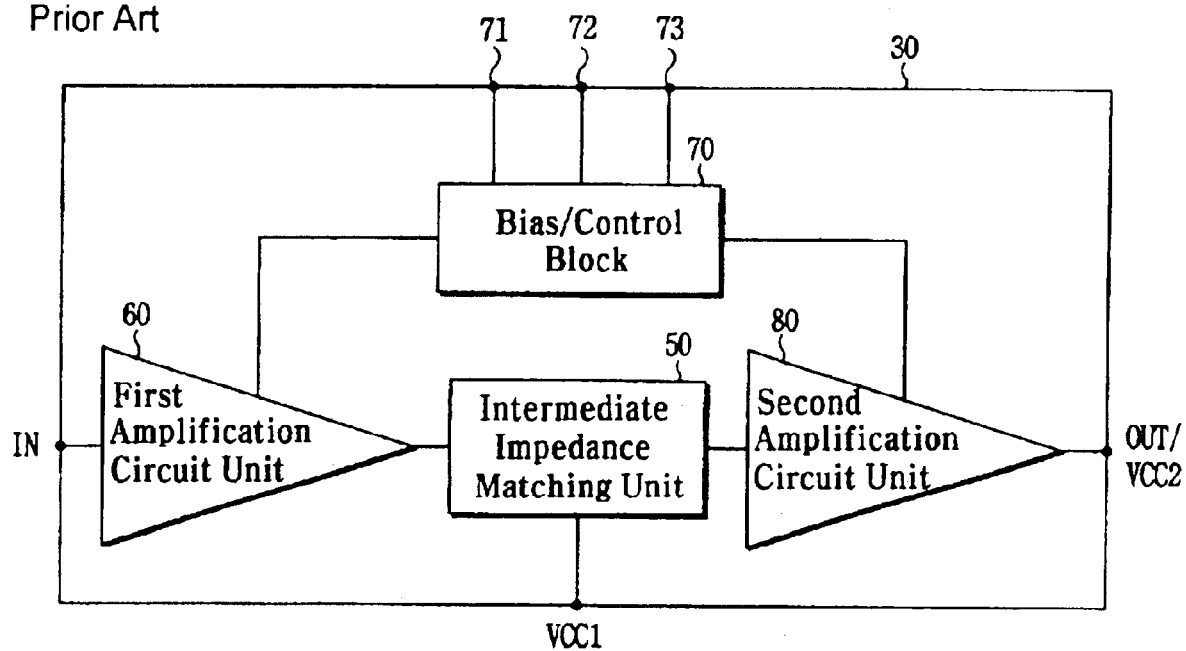
FIG. 2 is a constructional view showing functional units of a conventional high-frequency power amplifier.
Figure 3:
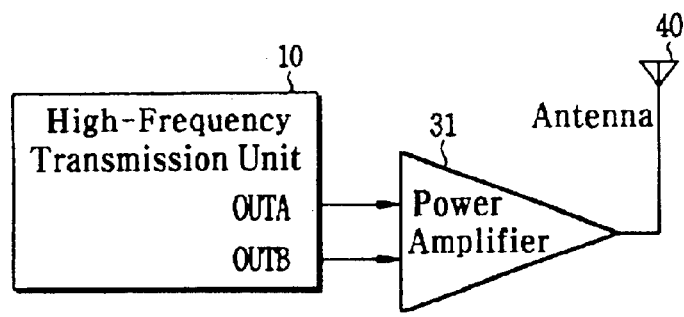
FIG. 3 is a constructional view showing an output port of a communication system using a high-frequency power amplifier having differential inputs according to the present invention.

FIG. 3 is a constructional view showing an output port of a communication system using a high-frequency power amplifier 31 having differential inputs according to the present invention.

As shown in FIG. 3, the output port of the communication system according to the present invention includes a high-frequency transmission unit 10 and a high-frequency power amplifier having differential inputs 31. Two output signals OUTA, OUTB output from the high-frequency transmission unit 10 are input to the high-frequency power amplifier 31 having differential inputs, and the high-frequency power amplifier 31 outputs a single output signal amplified using a voltage difference between the two signals OUTA, OUTB to an antenna.

Figure 4:
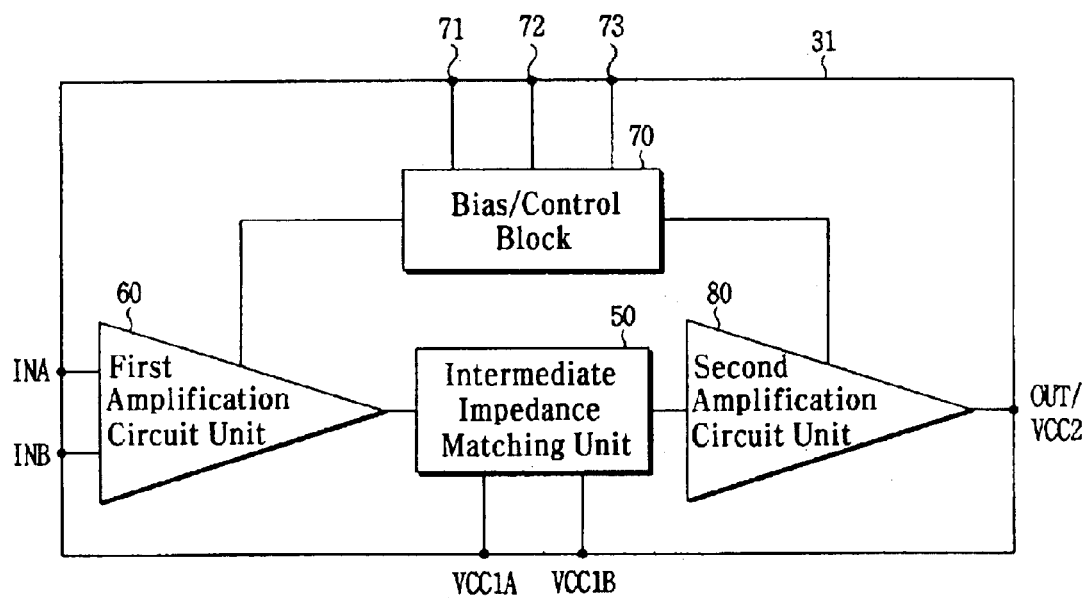
FIG. 4 is a constructional view showing functional units of a high-frequency power amplifier having differential inputs according to the present invention.

FIG. 4 is a constructional view showing functional units of a high-frequency power amplifier having differential inputs according to the present invention. As shown in FIG. 4, the high-frequency power amplifier having differential inputs includes a first amplification circuit unit 60, a second amplification circuit unit 80, an intermediate impedance matching unit 50, and a bias/control block 70.

The first amplification circuit unit 60 has difference inputs to perform a function as a signal conversion unit 20, and the second amplification circuit unit 80 is a common emitter power amplifier of class AB.

The intermediate impedance matching unit 50 matches an output impedance of the first amplification circuit unit 60 and an input impedance of the second amplification circuit unit 80 to minimize a reflection loss of a high-frequency signal, thereby to maximize a power of the high-frequency signal input to the second amplification circuit unit 80.

The bias/control block 70 includes bias circuit units of the first amplification circuit unit 60 and the second amplification circuit unit 80, a power breaking circuit unit, a power controlling circuit unit.

Now, a construction of a high-frequency power amplifier having differential inputs according to the present invention will be described in detail with reference to FIG. 5.

Figure 5:
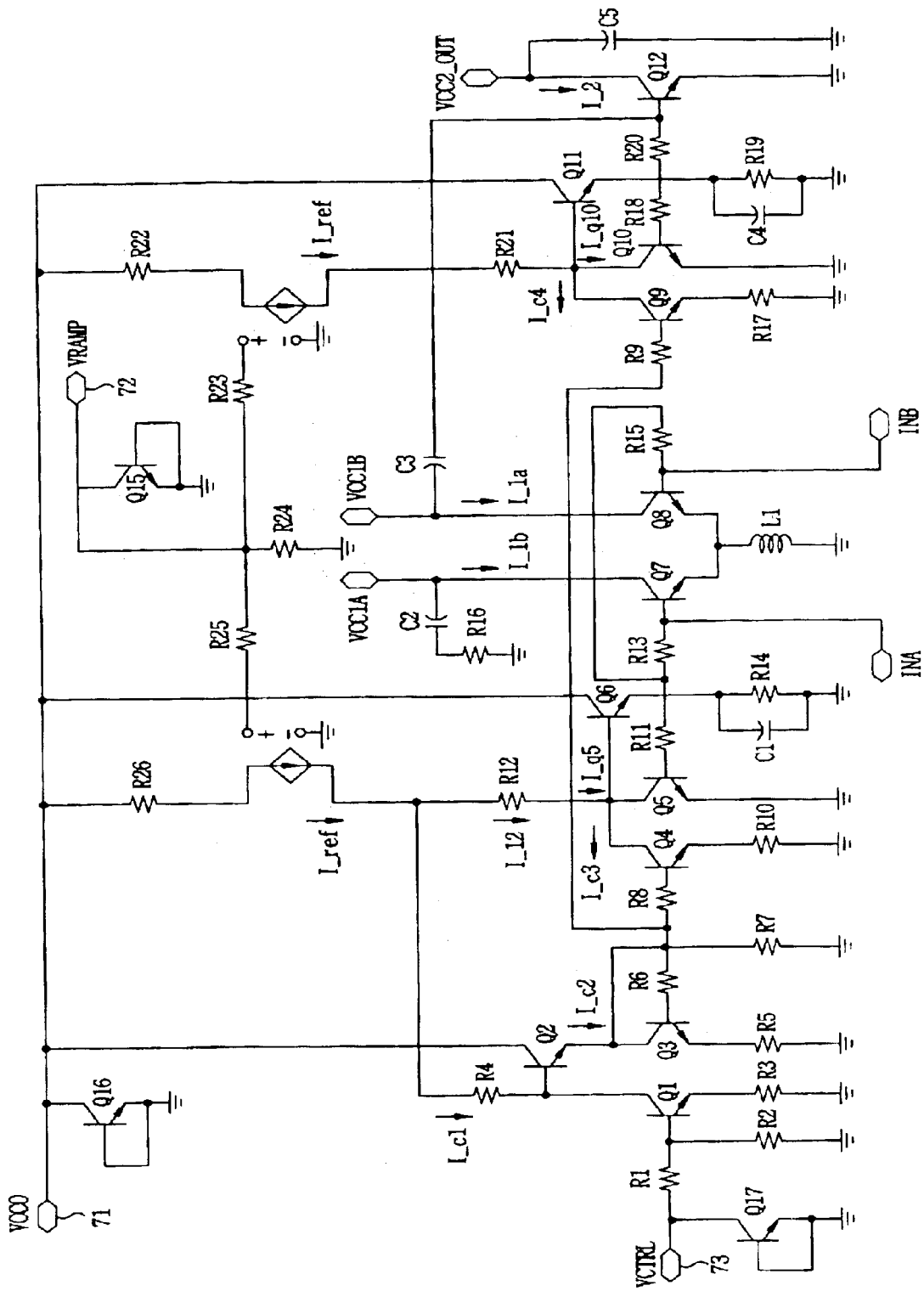
FIG. 5 is a circuit diagram showing a high-frequency power amplifier having differential inputs according to the present invention.

As shown in FIG. 5, the first amplification circuit unit 60 includes a seventh transistor Q7, an eighth transistor Q8, a first inductor L1, and differential input terminals INA, INB. The first inductor L1 serves as a negative feedback circuit for stabilizing the first amplification circuit unit 60.

The second amplification unit 80 is a class AB common emitter power amplifier including a twelfth transistor Q12 and a fifth capacitor C5.

The intermediate impedance matching unit 50 includes a third capacitor C3, a second capacitor C2, and a sixteenth resistor R16.

The bias/control block 70 includes the bias circuit unit of the first amplification circuit 60, the bias circuit unit of the second amplification unit 80, a power breaking circuit unit, and a power controlling circuit unit.

The bias circuit unit of the first amplification circuit unit 60 includes a fifth transistor Q5, a sixth transistor Q6, a plurality of resistors R11~R15 and a first capacitor C1. The bias circuit unit of the first amplification circuit unit 60 comprises a bias current mirror circuit for compensating for variation in a current gain of the first amplification circuit unit. The bias circuit unit of the first amplification circuit unit 60 serves for determining an operation reference point of the first amplification circuit unit 60.

The bias circuit unit of the second amplification circuit unit 80 includes a tenth transistor Q10, an eleventh transistor Q11, a plurality of resistor R18~R20 and a forth capacitor C4. The bias circuit unit of the second amplification circuit unit 80 comprises a bias current mirror circuit for compensating for variation in a current gain of the second amplification circuit unit. The bias circuit unit of the second amplification circuit unit 80 serves for determining an operation reference point of the second amplification circuit unit 80.

The resistors R11, R13~R15, R18~R20 and the first and forth capacitors C1, C4 are elements for stabilizing base voltages of the transistors.

The power breaking circuit unit includes a plurality of resistors R23~R25, voltage-controlled current sources SRC1, SRC2 and a fifth transistor Q15.

The power controlling circuit unit includes a plurality of resistors R1~R5, R10, R17, and a plurality of capacitors Q1~Q4, Q9, Q17. The seventh transistor Q17 serves as a protection diode for protecting inner circuits of the high-frequency power amplifier by absorbing a static electricity supplied to the power controlling terminal VCTRL 73.

Operations of the high-frequency power amplifier having differential inputs according to the present invention will be described in detail.

First, in the first amplification circuit unit 60, a voltage difference between two input signals input to two differential input terminals INA, INB is amplified, and the amplified voltage difference is output to the intermediate impedance matching unit 50 in the form of a single signal from a collector of the eighth transistor Q8.

The intermediate impedance matching unit 50 matches an output impedance of the eighth transistor Q8 and an input impedance of the twelfth transistor Q12 using the third capacitor C3 which is an intermediate impedance matching element to output the single signal output from the eighth transistor Q8 to a base of the twelfth transistor Q12.

Therefore, a reflection loss of the single high-frequency signal output from the eighth transistor Q8 is minimized, whereby the power of the signal input to the twelfth transistor Q12 is maximized.

In the second amplification circuit unit 80, the twelfth transistor Q12 receives and amplifies the output signal of the eighth transistor Q8 matched with the third capacitor C3 which is an intermediate impedance matching element, and outputs the amplified high-frequency signal to an antenna 40 through an output terminal of the second amplification circuit unit. The fifth capacitor C5 is an element for reducing an output high-frequency component of the second amplification circuit unit.

On the other hand, amplification factors of the first amplification circuit unit 60 and the second amplification circuit unit 80 are determined by bias currents supplied to collectors of the seventh, eighth and twelfth transistors, and procedures of supplying the bias current are as follows.

First, when a supply voltage Vcc is supplied to a supply voltage terminal VCC0 71 and a voltage which is the same as the supply voltage Vcc is supplied to the power control terminal VCTRL 73, the bias states of the circuits are as follows.

If a base current of the second transistor Q2 is ignored, a collector current of the first transistor Q1 is the same as a current L__cl I__cl supplied to a forth resistor R4 as shown in Equation 1 as follows:

$$I\_c1 \approx (V_{B1} - V_{BEONQ1})/R3 \qquad \text{[Equation 1]}$$

where a collector-emitter saturation voltage is ignored, $V_{B1}$ is a base voltage of the first transistor Q1, and $V_{BEONQ1}$ is a base-emitter turn-on voltage of the first transistor Q1.

A base voltage $V_{B1}$ of the first transistor is determined by distributing a voltage $V_{CTRL}$ of the power controlling terminal VCTRL 73 using a first resistor R1 and a second resistor R2 as follows:

$$V_{B1} \approx V_{CTRL} \cdot (R2/R1+R2). \qquad \text{[Equation 2]}$$

When the first transistor Q1 is saturated, the collector voltage of the first transistor Q1 is the same as the emitter voltage thereof as follows:

$$V_{C1} \approx I\_c1 \cdot R3. \qquad \text{[Equation 3]}$$

A voltage V1 is a node voltage distributed by a fourth resistor R4 and a twelfth resistor R12 as follows:

$$V1 = V_{c1} + I\_c1 \cdot R4 = I\_{12} \cdot R12 + 2 \cdot V_{BEON}. \quad \text{[Equation 4]}$$

On the other hand, a reference current $I\_c2$ of the third transistor is as follows:

$$I\_c2 \approx \{(R5+R7) \cdot V_{C1} - V_{BEONQ3} \cdot R5\}/(R5+R7). \quad \text{[Equation 5]}$$

In other word, the reference current $I\_c2$ of the third transistor is obtained by employing the voltage Vc1 obtained in the Equation 3 in the equation 5.

A collector current $I\_c3$ of the fourth transistor is determined by the reference current $I\_c2$ and emitter resistance ratio of the third transistor Q3 due to a current mirror relationship between the third transistor Q3 and the fourth transistor Q4 as follows:

$$I\_c3 \approx I\_c2 \cdot (R5/R10). \quad \text{[Equation 6]}$$

In addition, assuming that the current $I\_12$ is sufficiently lager than the current $I\_c1$ and the current $I\_c3$, the current $I\_12$ is the same as the current $I\_ref$ as follows:

$$\begin{aligned} I\_12 &\approx I\_ref \quad &\text{[Equation 7]} \\ &\approx \{Vcc - (2 \cdot V_{BEON})\}/(R26 + R12) \\ &\approx \{Vcc - (2 \cdot V_{BEON})\}/(R22 + R21) \\ &\approx \{Vcc - (Vc1 + I\_c1 \cdot R4)\}/R26. \end{aligned}$$

In addition, a fifth transistor Q5, a seventh transistor Q7 and an eighth transistor Q8 of the first amplification circuit unit 60 form a current mirror relationship, and a reference current of the current mirror is a current $I\_12$.

In other word, bias currents $I\_1b$, $I\_1a$ of the seventh transistor Q7 and the eighth transistor Q8 in the first amplification circuit unit are determined based on a ratio of the current $I\_12$: the current $I\_1b$: the current $I\_1a$=1:6:6 in accordance with on an area ratio of the transistor.

The bias current $I\_1b$, $I\_1a$ is supplied from the supply voltage terminals VCC1A, VCC1B of the first amplification circuit unit. A voltage of the supply voltage terminal VCC1A, VCC1B of the first amplification circuit unit is the same as a supply voltage Vcc of the supply voltage terminal VCCO 71.

In addition, a collector current $I\_c4$ of the ninth transistor Q9 is determined by the reference current $I\_c2$ and emitter resistance ratio of the third transistor Q3 due to a current mirror relationship between the third transistor Q3 and the ninth transistor Q9 as follows:

$$I\_c4 \approx I\_c2 \cdot (R5/R17). \quad \text{[Equation 8]}$$

In the equation 7, assuming that the current $I\_ref$ is sufficiently lager than the current $I\_c4$, a reference current in the current mirror relationship between the tenth transistor Q10 and the twelfth transistor Q12 can be a current $I\_ref$.

In other word, a bias current $I\_2$ of the twelfth transistor Q12 in the second amplification circuit unit 80 is determined based on a ratio of the current $I\_ref$:the current $I\_2$=1:16 in accordance with an area ratio of the transistor.

The current $I\_2$ is supplied from the supply voltage terminal. VCC2 OUT. A voltage of the supply voltage terminal VCC2 OUT in the second amplification circuit unit is the same as a supply voltage Vcc of the supply voltage terminal VCCO 71.

Accordingly, the bias currents $I\_1b$, $I\_1a$, $I\_2$ determined by the procedures become the collector currents of the seventh transistor, the eighth transistor, and the twelfth transistor to determine signal amplification factors of the first amplification circuit unit and the second amplification circuit unit.

On the other hand, when producing an integrated circuit, the sixth transistor Q6 and the eleventh transistor Q11 compensate a change of a bias current due to a change rate of an current amplification factor of the transistor to safely maintain the bias current $I\_1b$, $I\_1a$, $I\_2$.

In addition, the resistors R6~R9 stabilize base voltages of the fourth transistor Q4, the third transistor Q3, and the ninth transistor Q9.

On the other hand, procedures of controlling the power by the power controlling circuit unit are as follows.

In the operation of the power controlling circuit unit, the voltage of the power controlling terminal VCTRL 73 is controlled within a range of 0~Vcc [V] and bias currents of the first amplification circuit unit 60 and the second amplification circuit unit 80 are controlled, thereby controlling an output power of an antenna which is logarithmically proportional to the bias currents. Procedures of the operation will be described as follows below.

First, according to Equation 1 and Equation 2, a base voltage $V_{B1}$ of the first transistor Q1 and a bias current $I\_c1$ of the first transistor Q1 are decreased. Therefore, a base current of the second transistor Q2 can not be ignored.

Therefore, in a case of not including the first transistor Q1, a collector voltage VC1 of the first transistor Q1 is determined as follows:

$$V_{C1} \approx V1 - R_{L1} \cdot I\_c1 \quad \text{[Equation 9]}$$

where the voltage 1 is a node voltage distributed by a fourth resistor R4 and a twelfth resistor R12 as shown in the equation 4. $R_{L1}$ is an equivalent load resistor of the first transistor.

In other word, when a voltage of the power controlling terminal VCTRL 73 is decreased from the supply voltage to a ground voltage and the current $I\_c1$ is decreased as shown in the equation 1, the collector voltage $V_{C1}$ of the first transistor Q1 is increased as shown in the equation 9 and the collector current $I\_c2$ of the third transistor Q3 as shown in the equation 5. Therefore, the current $I\_c3$ is increased due to the current mirror relationship between the third transistor Q3 and the fourth transistor Q4 as shown in the equation 6.

In addition, according to Equation 10 and Equation 11 as follows below, when the current $I\_c1$ and the current $I\_c3$ are increased, reference currents $I\_12$, $I\_q10$ of the bias current $I\_1b$, $I\_1a$ of the first amplification circuit unit 60 are decreased, thereby decreasing the bias current $I\_1a$. $I\_1b$ of the first amplification circuit unit 60.

$$I\_12 \approx I\_ref - I\_c1 \quad \text{[Equation 10]}$$

$$I\_q5 \approx I\_12 - I\_c3 \quad \text{[Equation 11]}$$

Furthermore, when a voltage of the power controlling terminal VCTRL 73 is decreased, a reference current $I\_ref$ of the second amplification circuit unit 80 is divided into a collector current $I\_q10$ of the tenth transistor Q10 and a current $I\_c4$ as follows:

$$I\_q10 \approx I\_ref - I\_c4. \quad \text{[Equation 12]}$$

Therefore, the collector current of the tenth transistor Q10 is decreased proportionally to increment in the current $I\_c4$, and the bias current of the second amplification circuit unit 80 is decreased due to the current mirror relationship between the tenth transistor Q10 and the twelfth transistor Q12. A high-frequency power of the high-frequency power amplifier proportional to decrement in such a bias current is decreased.

The decreased ratio is the same as a proportional constant determined by a ratio of the first resistor R1 and the second resistor R2 and a ratio of a tenth resistor R10 and a seventeenth resistor R17. The bias currents $I\_1a, I\_1b, I\_2$ of the first amplification unit and the second amplification circuit unit are exponentially decreased depending on the voltage of a power controlling terminal VCTRL 73. Accordingly, a power mW of high-frequency power amplifier proportional to a square of the bias currents $I\_1a, I\_1b, I\_2$ is decreased.

Furthermore, converting the power mW into the power dBm, an output power of the antenna is controlled by a unit of dB/V proportionally to the voltage of the power controlling terminal VCTRL 73.

On the other hand, procedures of breaking a power in the power breaking circuit unit will be described as follows.

In the power breaking circuit unit, a fifteenth transistor Q15 is a protection diode for playing a role of protecting an inner circuit of the high-frequency power amplifier by absorbing a static electricity supplied to the power breaking terminal VRAMP 72.

When the voltage of the power breaking terminal VRAMP 72 is decreased into a ground voltage in order to breaking a power of a high-frequency signal output to the antenna, the current $I\_ref$ of voltage-controlled current sources SRC1, SRC2 is broken off by means of a twenty-forth resistor R24, a twenty-fifth resistor R25 and a twenty-third resistor R23.

When the current $I\_ref$ is cut off, the bias current $I\_12$ of the fifth transistor Q5 and the bias current of the tenth transistor Q10 is cut off. Therefore, the bias currents $I\_1a, I\_1b$ of the first amplification circuit unit forming a current mirror relationship with the fifth transistor Q5 and the tenth transistor Q10 and the bias current of the twelfth transistor Q12 of the second amplification circuit unit are cut off.

Accordingly, the current $I\_ref$ of the voltage-controlled current source SRC1, SRC2 is broken off or not based on the voltage of the power breaking terminal VRAMP 72 which is a voltage between both sides of the resistor R24.

As described above, according to the communication system employing a high-frequency power amplifier having differential inputs of the present invention, it is possible to maintain performance of the communication system with decreasing the number of components and to reduce production cost, because a signal conversion unit used in the conventional communication system employing a power amplifier having a single input and a single output is not used.

What is claimed is:

1. A high-frequency power amplifier having differential inputs, comprising:
    a power supply unit;
    a first amplification circuit unit for amplifying high-frequency differential input signals of differential input terminals INA, INB into outputting a single high-frequency signal;
    an intermediate impedance matching unit for impedance-matching the single high-frequency signal amplified by the first amplification circuit unit;
    a second amplification circuit unit for receiving and amplifying the impedance-matched single high-frequency signal from the intermediate impedance matching unit and outputting the amplified signal to an antenna through an output terminal thereof;
    a power control circuit unit for controlling a power output to the antenna through the output terminal of the second amplification circuit unit by varying a voltage of a power control terminal;
    a first bias circuit unit for determining an operation reference point of the first amplification circuit unit; and
    a second bias circuit unit for determining an operation reference point of the second amplification circuit unit.

2. A high-frequency power amplifier having differential inputs according to claim 1, further comprising a power breaking circuit unit for breaking the power output to the antenna through the output terminal of the second amplification circuit unit when a voltage of a power breaking terminal becomes a ground voltage.

3. A high-frequency power amplifier having differential inputs according to claim 1, wherein the second amplification circuit unit comprises one or more amplification elements and one or more elements for decreasing an output high frequency component of the second amplification circuit unit.

4. A high-frequency power amplifier having differential inputs according to claim 1, wherein the intermediate impedance matching unit comprises one or more intermediate impedance matching elements and impedance elements.

* * * * *